United States Patent
Sugimoto et al.

(10) Patent No.: US 7,012,814 B2
(45) Date of Patent: Mar. 14, 2006

(54) CIRCUIT BOARD CONNECTION STRUCTURE, METHOD FOR FORMING THE SAME, AND DISPLAY DEVICE HAVING THE CIRCUIT BOARD CONNECTION STRUCTURE

(75) Inventors: Shinichi Sugimoto, Matsusaka (JP); Tsuyoshi Tamura, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 8 days.

(21) Appl. No.: 10/389,878

(22) Filed: Mar. 18, 2003

(65) Prior Publication Data

US 2003/0179551 A1    Sep. 25, 2003

(30) Foreign Application Priority Data

Mar. 22, 2002   (JP) ............................. 2002-081586
Jan. 16, 2003   (JP) ............................. 2003-007721

(51) Int. Cl.
   *H05K 1/14*   (2006.01)
(52) U.S. Cl. ..................... 361/803; 349/149; 349/151; 349/152
(58) Field of Classification Search ........ 349/149–152, 349/187, 191; 361/784, 803
   See application file for complete search history.

(56) References Cited

U.S. PATENT DOCUMENTS

| | | | | |
|---|---|---|---|---|
| 5,546,279 A | * | 8/1996 | Aota et al. ................... | 361/749 |
| 5,592,365 A | * | 1/1997 | Sugimoto et al. ........... | 361/789 |
| 5,729,315 A | * | 3/1998 | Takahashi et al. .......... | 349/149 |
| 6,266,120 B1 | * | 7/2001 | Han ............................ | 349/150 |
| 6,414,741 B1 | * | 7/2002 | Hasegawa et al. .......... | 349/187 |

FOREIGN PATENT DOCUMENTS

| | | | |
|---|---|---|---|
| JP | 05-198936 | | 8/1993 |
| JP | 05198936 | | 8/1993 |
| JP | 06208124 A | * | 7/1994 |
| JP | 10-301138 | | 11/1998 |
| JP | 10301138 A | * | 11/1998 |
| JP | 2001-230510 | | 8/2001 |

OTHER PUBLICATIONS

Korean Office Action mailed Mar. 31, 2005 (w/partial English translation thereof).

* cited by examiner

*Primary Examiner*—John B. Vigushin
(74) *Attorney, Agent, or Firm*—Nixon & Vanderhye P.C.

(57) ABSTRACT

The circuit board connection structure of the invention has a first circuit board and a second circuit board bonded together with a conductive resin layer. The first circuit board has a first terminal region including a plurality of first terminal electrodes arranged in a first direction and a dummy electrode placed next to the first terminal region in the first direction. The second circuit board has a second terminal region including a plurality of second terminal electrodes arranged in the first direction. The second terminal region is placed to face the first terminal region via the conductive resin layer, and the respective second terminal electrodes are electrically connected to the corresponding first terminal electrodes. The conductive resin layer covers at least part of the dummy electrode, and the at least part of the dummy electrode covered with the conductive resin layer has a plurality of openings.

48 Claims, 9 Drawing Sheets

CIRCUIT BOARD CONNECTION STRUCTURE, METHOD FOR FORMING THE SAME, AND DISPLAY DEVICE HAVING THE CIRCUIT BOARD CONNECTION STRUCTURE

BACKGROUND OF THE INVENTION

The present invention relates to a circuit board connection structure, a method for forming the circuit board connection structure, a display device having the circuit board connection structure, and a method for fabricating the display device.

FIG. 8 is a cross-sectional view of a conventional active matrix liquid crystal display device. The active matrix liquid crystal display device of FIG. 8 includes a liquid crystal panel 2 and a circuit board 6 connected to each other via a flexible printed wiring board 3. The liquid crystal panel 2 includes an active matrix substrate 2A, a counter substrate 2B and a liquid crystal layer 1 interposed between the substrates 2A and 2B. A driving LSI is mounted on the flexible printed wiring board 3. A chip capacitor, a control IC and the like are mounted on the circuit board 6.

To drive the liquid crystal layer 1, an input signal must be supplied to the active matrix substrate 2A. In the liquid crystal display device of FIG. 8, the flexible printed wiring board 3 and the circuit board 6 are electrically connected to the active matrix substrate 2A, to thereby allow supply of a predetermined input signal from the flexible printed wiring board 3 and the circuit board 6 to the active matrix substrate 2A. The conventional structures of the circuit board 6 and the flexible printed wiring board 3, as well as the connection structure of these boards, will be described with reference to FIGS. 9 and 10.

FIG. 9 is an illustration of a conductive adhesive used for bonding between the circuit board 6 and the flexible printed wiring board 3. FIG. 10 is a partial plan view of the circuit board 6 and the flexible printed wiring board 3 of the liquid crystal display device of FIG. 8, viewed in the direction of the arrow in FIG. 8.

An anisotropic conductive film (ACF), a conductive adhesive tape shown in FIG. 9, is used for bonding between the circuit board 6 and the flexible printed wiring board 3. The ACF shown in FIG. 9 has a double-layer structure composed of an ACF layer 4 as a conductive resin layer (conductive adhesive layer) and a separator 5. The separator 5 of the ACF is finally removed and the remaining ACF layer 4 is set under heat to thereby bond the two boards 6 and 3 together.

Referring to FIG. 10, the circuit board 6 has a plurality of stripe terminal electrodes 7 and 8 formed in an edge region thereof. The flexible printed wiring board 3 also has a plurality of stripe terminal electrodes 20 and 22 in an edge region thereof. The circuit board 6 and the flexible printed wiring board 3 are connected with each other in the following manner.

First, the ACF shown in FIG. 9 is placed on the circuit board 6 to cover the terminal electrodes 7 and 8 partly and subjected to temporary press bonding to the circuit board 6 (including heating). The separator 5 is then separated from the ACF layer 4. Thereafter, the flexible printed wiring board 3 is aligned with the circuit board 6, placed on the circuit board 6 via the ACF layer 4, and subjected to final press bonding (including heating). In this way, the circuit board 6 and the flexible printed wiring board 3 are bonded together via the ACF layer 4, and this electrically connects the terminal electrodes 7 and 8 of the circuit board 6 with the terminal electrodes 20 and 22 of the flexible printed wiring board 3.

In the conventional circuit board 6, the terminal electrodes 7, which are to be electrically connected with the outermost terminal electrodes 20 located closest to the edges of the flexible printed wiring board 3, among the plurality of stripe terminal electrodes 7 and 8, have a shape wider than the terminal electrodes 8 and have a continuous surface. The surface of the terminal electrodes 7 is made continuous to facilitate detection of whether or not the ACF layer 4 has separated from the terminal electrodes after the temporary press bonding of the ACF layer 4 to the circuit board 6. The terminal electrodes 7 are made wide because faulty connection will occur if the terminal electrodes of the flexible printed wiring board 3 fail to match with the terminal electrodes 7. The reason why only the terminal electrodes 7 are made wide selectively is as follows.

The ACF layer 4 is set under heat during the bonding between the circuit board 6 and the flexible printed wiring board 3. During cooling of these boards 6 and 3 after the heating for the setting, the flexible printed wiring board 3 is generally cooled more easily than the circuit board 6. Therefore, portions of the ACF layer 4 existing in regions corresponding to the edges of the flexible printed wiring board 3 tend to separate, and as a result, faulty electrical connection tends to occur between the ACF layer 4 and the terminal electrodes of the flexible printed wiring board 3 particularly in these regions. To suppress this occurrence of faulty electrical connection, the terminal electrodes 7 in the regions corresponding to the edges of the flexible printed wiring board 3 are made wide.

However, the conventional circuit board connection structure shown in FIG. 10 has the following problems.

First, when the conductive resin is heated (during temporary press bonding or final press bonding), the conductive resin on the terminal electrode 7 tends to flow from the surface thereof down to the board due to the solid shape of the terminal electrode 7. As a result, the conductive resin layer formed on the terminal electrode 7 becomes too thin to permit bonding of the terminal electrode 7 to the corresponding terminal electrode 20 (transfer failure) in some cases. The proportion of the bonding failure is particularly high when the terminal electrode 7 has the wide shape and an end of the conductive resin layer 4 is located on the terminal electrode 7. This causes faulty electrical connection between the boards, and thus lowers the device fabrication efficiency.

Secondly, during the bonding of the flexible printed wiring board 3 to the circuit board 6, the positioning is performed only in the direction of the pitch of the terminal electrodes 7 and 20 shown by arrow P1 in FIG. 10. No means is provided for examining a displacement in the direction of the length of the terminal electrodes 7 and 20 shown by arrow P2.

In view of the above, an object of the present invention is preventing the conductive resin layer from separating from the terminal electrodes or the circuit board. Another object of the present invention is achieving high-precision electrical connection between the terminal electrodes of the two boards with no displacement from each other.

SUMMARY OF THE INVENTION

The circuit board connection structure according to an aspect of the present invention is a circuit board connection structure having a first circuit board and a second circuit board bonded together with a conductive resin layer. The first circuit board has a first terminal region including a plurality of first terminal electrodes arranged in a first direction and a dummy electrode placed next to the first terminal region in the first direction. The second circuit board has a second terminal region including a plurality of second terminal electrodes arranged in the first direction. The second terminal region is placed to face the first terminal region via the conductive resin layer, the respective second terminal electrodes being electrically connected to the corresponding first terminal electrodes. The conductive resin layer covers at least part of the dummy electrode, and the at least part of the dummy electrode covered with the conductive resin layer has a plurality of openings.

The plurality of openings are preferably arranged in the first direction and a second direction substantially perpendicular to the first direction, or arranged in a matrix in the first direction and a second direction substantially perpendicular to the first direction.

Preferably, each of the plurality of openings has a side parallel to the first direction and a side parallel to a second direction substantially perpendicular to the first direction.

The plurality of openings preferably have an identical shape and size.

Preferably, the conductive resin layer has a first side extending in the first direction and a second side extending in a second direction substantially perpendicular to the first direction, the first side crosses the plurality of first terminal electrodes, and the second side is located on the dummy electrode.

Preferably, at least part of a periphery of the dummy electrode has a concave and convex shape, and the first side of the conductive resin layer crosses the periphery of the concave and convex shape.

The dummy electrode preferably has a misalignment check mark.

Preferably, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a third side extending in the first direction, and the third side has a concave and convex shape.

Preferably, the outermost first terminal electrode has two fourth sides extending in a second direction substantially perpendicular to the first direction, and the distance between the two fourth sides is greater than the width of each of the plurality of first terminal electrodes other than the outermost first terminal electrode in the first direction.

Preferably, the first circuit board is a printed circuit board, and the second circuit board is a flexible board.

The circuit board connection structure according to another aspect of the present invention is a circuit board connection structure having a first circuit board and a second circuit board bonded together with a conductive resin layer. The first circuit board has a first terminal region including a plurality of first terminal electrodes arranged in a first direction. The second circuit board has a second terminal region including a plurality of second terminal electrodes arranged in the first direction. The second terminal region is placed to face the first terminal region via the conductive resin layer, the respective second terminal electrodes being electrically connected to the corresponding first terminal electrodes. An outermost first terminal electrode located outermost in the first direction among the plurality of first terminal electrodes is electrically connected with an outermost second terminal electrode located outermost in the first direction among the plurality of second terminal electrodes. The outermost first terminal electrode has a first side extending in the first direction, and the first side has a concave and convex shape.

Preferably, the outermost first terminal electrode has two second sides extending in a second direction substantially perpendicular to the first direction, and the distance between the two second sides is greater than a width of each of the plurality of first terminal electrodes other than the outermost first terminal electrode in the first direction.

Preferably, the concave and convex shape of the first side of the outermost first terminal electrode has a plurality of third sides substantially parallel to the first direction and a plurality of fourth sides substantially parallel to a second direction substantially perpendicular to the first direction.

Preferably, the conductive resin layer has a fifth side extending in the first direction, and the fifth side crosses the plurality of fourth sides of the outermost first terminal electrode.

The outermost first terminal electrode preferably has a plurality of openings.

The plurality of openings are preferably arranged in the first direction and a second direction substantially perpendicular to the first direction, or arranged in a matrix in the first direction and a second direction substantially perpendicular to the first direction.

Preferably, each of the plurality of openings has a side parallel to the first direction and a side parallel to a second direction substantially perpendicular to the first direction.

Preferably, the conductive resin layer has a fifth side extending in the first direction and a sixth side extending in a second direction substantially perpendicular to the first direction, and at least part of the fifth side is placed in at least one opening among the plurality of openings of the outermost first terminal electrode, and at least part of the sixth side is placed in at least one opening among the plurality of openings of the outermost first terminal electrode.

The plurality of openings preferably have an identical shape and size.

Preferably, the first circuit board further has a dummy electrode placed next to the first terminal region in the first direction, the conductive resin layer covers at least part of the dummy electrode, and the at least part of the dummy electrode covered with the conductive resin layer has a plurality of openings.

The plurality of openings of the dummy electrode are preferably placed in a matrix in the first direction and a second direction substantially perpendicular to the first direction.

Preferably, the conductive resin layer has a sixth side extending in a second direction substantially perpendicular to the first direction, and the sixth side is located on the dummy electrode.

Preferably, at least part of a periphery of the dummy electrode has a concave and convex shape, the conductive resin layer has a fifth side extending in the first direction, and the fifth side of the conductive resin layer crosses the periphery of the concave and convex shape.

Preferably, the first circuit board is a printed circuit board, and the second circuit board is a flexible board.

The circuit board connection structure according to yet another aspect of the present invention is a circuit board connection structure having a first circuit board and a second circuit board bonded together with a conductive resin layer. The first circuit board has a first terminal region including a plurality of first terminal electrodes arranged in a first direction. The second circuit board has a second terminal region including a plurality of second terminal electrodes arranged in the first direction. The second terminal region is placed to face the first terminal region via the conductive resin layer, the respective second terminal electrodes being electrically connected to the corresponding first terminal electrodes. An outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings.

Preferably, the outermost first terminal electrode has two first sides extending in a second direction substantially perpendicular to the first direction, and the distance between the two first sides is greater than a width of each of the plurality of first terminal electrodes other than the outermost first terminal electrode in the first direction.

The plurality of openings are preferably arranged in the first direction and a second direction substantially perpendicular to the first direction, or arranged in a matrix in the first direction and a second direction substantially perpendicular to the first direction.

Preferably, each of the plurality of openings has a side parallel to the first direction and a side parallel to a second direction substantially perpendicular to the first direction.

Preferably, the conductive resin layer has a second side extending in the first direction and a third side extending in a second direction substantially perpendicular to the first direction, and at least part of the second side is placed in at least one opening among the plurality of openings of the outermost first terminal electrode, and at least part of the third side is placed in at least one opening among the plurality of openings of the outermost first terminal electrode.

The plurality of openings preferably have an identical shape and size.

Preferably, the first circuit board further has a dummy electrode placed next to the first terminal region in the first direction, the conductive resin layer covers at least part of the dummy electrode, and the at least part of the dummy electrode covered with the conductive resin layer has a plurality of openings.

The plurality of openings of the dummy electrode are preferably placed in a matrix in the first direction and a second direction substantially perpendicular to the first direction.

Preferably, the conductive resin layer has a third side extending in a second direction substantially perpendicular to the first direction, and the third side is located on the dummy electrode.

Preferably, at least part of a periphery of the dummy electrode has a concave and convex shape, the conductive resin layer has a second side extending in the first direction, and the second side of the conductive resin layer crosses the periphery of the concave and convex shape.

Preferably, the first circuit board is a printed circuit board, and the second circuit board is a flexible board.

The display device of the present invention has the circuit board connection structure described above, and includes a display panel having at least one substrate, the second circuit board connected to the at least one substrate, and the first circuit board.

Alternatively, the display device of the present invention has the circuit board connection structure described above, and includes a display panel having the first circuit board as at least one substrate, and the second circuit board.

Preferably, the display panel is a liquid crystal panel, an organic EL panel, an inorganic EL panel or a PDP.

The method for forming a connection structure according to an aspect of the present invention is a method for forming a connection structure of a first circuit board and a second circuit board bonded together with a conductive resin layer. The method includes the steps of: preparing the first circuit board having a first terminal region including a plurality of first terminal electrodes arranged in a first direction and a dummy electrode placed next to the first terminal region in the first direction, the dummy electrode having a plurality of openings arranged in the first direction and a second direction substantially perpendicular to the first direction; preparing the second circuit board having a second terminal region including a plurality of second terminal electrodes arranged in a third direction, the plurality of second terminal electrodes having an outermost second terminal electrode located outermost in the third direction; forming the conductive resin layer to cover at least part of each of the plurality of first terminal electrodes and at least part of the dummy electrode; determining relative positions of the dummy electrode and the outermost second terminal electrode based on an optical pattern obtained by placing the second terminal region to face the first terminal region via the conductive resin layer so that the first direction and the third direction are parallel to each other and optically detecting placement of the plurality of openings of the dummy electrode; aligning the first circuit board and the second circuit board with each other based on the determined relative positions; and bonding the first circuit board and the second circuit board together by setting the conductive resin layer.

Preferably, the step of determining relative positions includes the steps of: taking images of the first circuit board and the second circuit board with an image pickup device; and determining the relative positions of the dummy electrode and the outermost second terminal electrode using a difference between the reflectivity of a region of the dummy electrode other than the plurality of openings and the reflectivity of the plurality of openings and a difference between the reflectivity of a region of the second circuit board other than the outermost second terminal electrode and the reflectivity of the outermost second terminal electrode.

The method for forming a connection structure according to another aspect of the present invention is a method for forming a connection structure of a first circuit board and a second circuit board bonded together with a conductive resin layer. The method includes the steps of: preparing the first circuit board having a first terminal region including a plurality of first terminal electrodes arranged in a first direction, the plurality of first terminal electrodes having an outermost first terminal electrode located outermost in the first direction, the outermost first terminal electrode having a first side extending in the first direction, the first side having a concave and convex shape; preparing the second circuit board having a second terminal region including a plurality of second terminal electrodes arranged in a second direction, the plurality of second terminal electrodes having an outermost second terminal electrode located outermost in the second direction; forming the conductive resin layer to cover at least part of each of the plurality of first terminal electrodes; determining relative positions of the outermost first terminal electrode and the outermost second terminal electrode based on an optical pattern obtained by placing the second terminal region to face the first terminal region via the conductive resin layer so that the first direction and the second direction are parallel to each other and optically detecting the concave and convex shape and placement of the first side of the outermost first terminal electrode; aligning the first circuit board and the second circuit board with each other based on the determined relative positions; and bonding the first circuit board and the second circuit board together by setting the conductive resin layer.

Preferably, in the step of preparing the first circuit board, the first circuit board further has a dummy electrode located next to the first terminal region in the first direction, the dummy electrode having a plurality of openings, and in the step of forming the conductive resin layer, the conductive resin layer is formed to cover the plurality of openings of the dummy electrode.

Preferably, the step of determining relative positions includes the steps of: taking images of the first circuit board and the second circuit board with an image pickup device; and determining the relative positions of the outermost first terminal electrode and the outermost second terminal electrode using a difference between the reflectivity of a region of the first circuit board other than the outermost first terminal electrode and the reflectivity of the outermost first terminal electrode and a difference between the reflectivity of a region of the second circuit board other than the outermost second terminal electrode and the reflectivity of the outermost second terminal electrode.

The method for forming a connection structure according to yet another aspect of the present invention is a method for forming a connection structure of a first circuit board and a second circuit board bonded together with a conductive resin layer. The method includes the steps of: preparing the first circuit board having a first terminal region including a plurality of first terminal electrodes arranged in a first direction, the plurality of first terminal electrodes having an outermost first terminal electrode located outermost in the first direction, the outermost first terminal electrode having a plurality of openings; preparing the second circuit board having a second terminal region including a plurality of second terminal electrodes arranged in a second direction, the plurality of second terminal electrodes having an outermost second terminal electrode located outermost in the second direction; forming the conductive resin layer to cover at least part of each of the plurality of first terminal electrodes; determining relative positions of the outermost first terminal electrode and the outermost second terminal electrode based on an optical pattern obtained by placing the second terminal region to face the first terminal region via the conductive resin layer so that the first direction and the second direction are parallel to each other and optically detecting placement of the plurality of openings of the outermost first terminal electrode; aligning the first circuit board and the second circuit board with each other based on the determined relative positions; and bonding the first circuit board and the second circuit board together by setting the conductive resin layer.

Preferably, in the step of preparing the first circuit board, the first circuit board further has a dummy electrode located next to the first terminal region in the first direction, the dummy electrode having a plurality of openings, and in the step of forming the conductive resin layer, the conductive resin layer is formed to cover the plurality of openings of the dummy electrode.

Preferably, the step of determining relative positions includes the steps of: taking images of the first circuit board and the second circuit board with an image pickup device; and determining the relative positions of the outermost first terminal electrode and the outermost second terminal electrode using a difference between the reflectivity of a region of the first circuit board other than the outermost first terminal electrode and the reflectivity of the outermost first terminal electrode and a difference between the reflectivity of a region of the second circuit board other than the outermost second terminal electrode and the reflectivity of the outermost second terminal electrode.

DETAILED DESCRIPTION OF THE INVENTION

Hereinafter, the present invention will be described with reference to the relevant drawings. When the present invention is applied to the liquid crystal display device of FIG. 8, the first circuit board corresponds to the printed circuit board 6 and the second circuit board corresponds to the flexible printed wiring board 3. The flexible printed wiring board 3 is connected with the active matrix substrate 2A at the end thereof other than the end at which the flexible printed wiring board 3 is bonded to the printed circuit board 6. By this connection, a predetermined input signal is supplied to the active matrix substrate 2A from the flexible printed wiring board 3 and the printed circuit board 6. Alternatively, the first circuit board may be used for the active matrix substrate 2A of the liquid crystal display device of FIG. 8. In this case, the circuit board connection structure of the present invention is applied to the connection structure between the active matrix substrate 2A and the flexible printed wiring board 3. Otherwise, the first circuit board may be used for both the active matrix substrate 2A and the printed circuit board 6. In this case, the circuit board connection structure of the present invention is applied both to the connection structure between the active matrix substrate 2A and the flexible printed wiring board 3 and the connection structure between the printed circuit board 6 and the flexible printed wiring board 3. The present invention is suitably applicable to various types of display devices, such as liquid crystal display devices including active matrix liquid crystal display devices and PALC devices, PDPs and organic and inorganic EL panels.

Figure 1A:
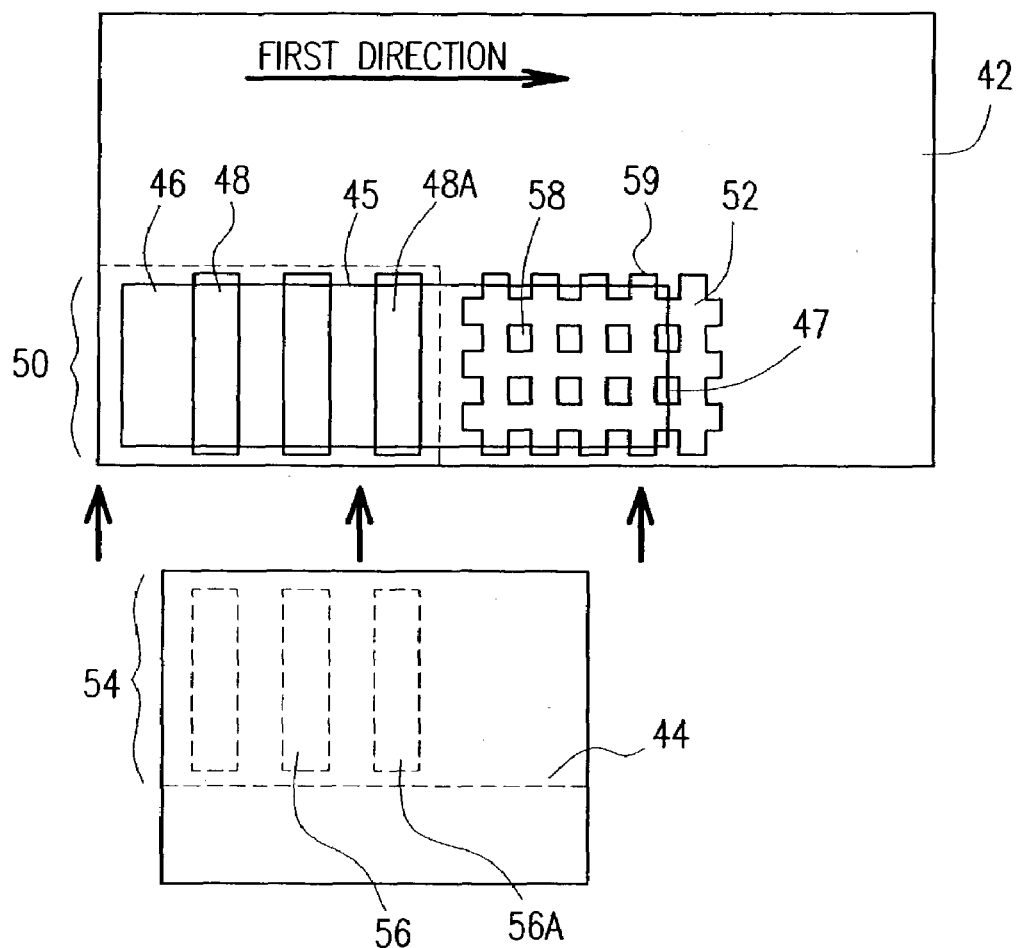
FIGS. 1A and 1B are diagrammatic plan views of a circuit board connection structure according to the first aspect of the present invention.
Figure 1B:
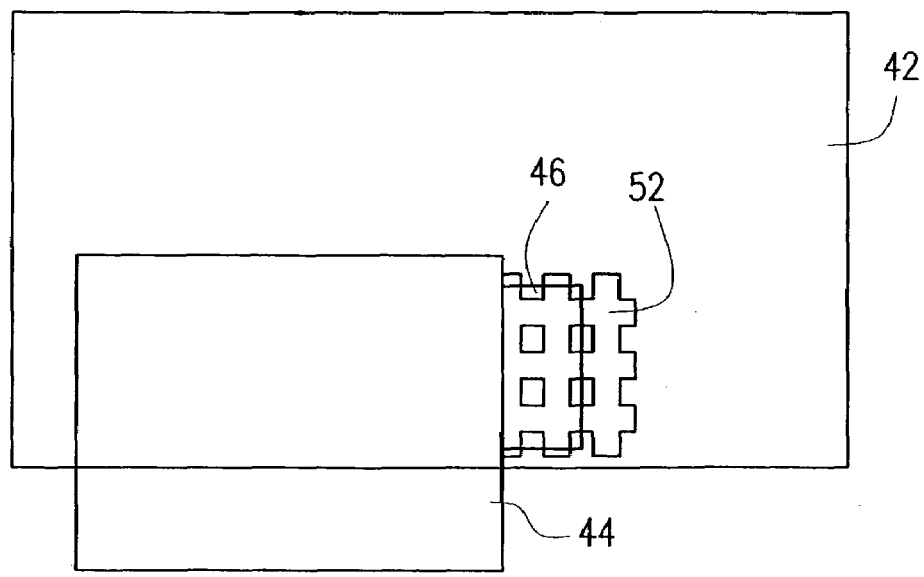

A circuit board connection structure according to the first aspect of the present invention will be described with reference to FIGS. 1A and 1B. FIGS. 1A and 1B are plan views schematically showing the circuit board connection structure.

The circuit board connection structure according to the first aspect of the present invention is a structure composed of a first circuit board 42 and a second circuit board 44 shown in FIG. 1A, which are bonded together with a conductive resin layer 46 as shown in FIG. 1B.

The first circuit board 42 includes a first terminal region 50 and a dummy electrode 52 placed next to the first terminal region 50 in the first direction. In the first terminal region 50, a plurality of first terminal electrodes 48 are arranged in the first direction. The second circuit board 44 includes a second terminal region 54, in which a plurality of second terminal electrodes 56 are arranged in the first direction. The first and second circuit boards 42 and 44 are placed with respect to each other so that the second terminal region 54 faces the first terminal region 50 via the conductive resin layer 46 as shown in FIG. 1B. By this placement, the respective second terminal electrodes 56 are electrically connected with the corresponding first terminal electrodes 48. The conductive resin layer 46 covers at least part of the dummy electrode 52. The part of the dummy electrode 52 covered with the conductive resin layer 46 has a plurality of openings 58.

One feature of the circuit board connection structure described above is that the dummy electrode 52 having a plurality of openings 58 is placed next to the first terminal region 50 and at least part of the dummy electrode 52 is covered with the conductive resin layer 46. The dummy electrode 52 may be formed on the first circuit board 42 simultaneously with the formation of the first terminal electrodes 48 by patterning the same metal layer. The dummy electrode 52 is not an electrode provided for output of a signal from an element mounted on the first circuit board 42 and therefore has no electrical connection with any elements.

When only electrodes having a continuous surface (i.e., without openings) are formed on the circuit board and, in particular, when the electrodes have a large surface area, as in the conventional circuit board connection structure, the problem described above arises that the conductive resin layer 46 formed on the electrodes tends to separate from the electrodes. The circuit board connection structure of the present invention includes the dummy electrode 52 having a plurality of openings 58 and at least part of the dummy electrode 52 is covered with the conductive resin layer 46. Therefore, the conductive resin layer 46 adheres to the portions of the circuit board 42 exposed through the openings 58 of the dummy electrode 52 and the walls of the openings 58. This increases the adhesion area of the conductive resin layer 46, and thus the conductive resin layer 46 becomes more resistant to separating from the dummy electrode, compared with the formation of the conductive resin layer 46 on the board on which only electrodes having a continuous surface are formed.

As the dummy electrode 52, suitably used is one having a plurality of openings 58 arranged in the first direction and a second direction substantially perpendicular to the first direction. Having the dummy electrode 52 of this shape, the plurality of openings 58 can be used for alignment between the first circuit board 42 and the second circuit board 44 during the bonding between the first and second circuit boards 42 and 44 in the process of forming the connection structure of the present invention. In this case, therefore, the dummy electrode 52 is usable not only for prevention of separating of the conductive resin layer 46, but also for alignment between the first and second circuit boards 42 and 44. For example, the sides of the second circuit board 44 parallel to the first direction and the second direction may be made to match with a row of the openings 58 arranged in the first direction and a row of the openings 58 arranged in the second direction, respectively, to thereby achieve the alignment between the two circuit boards 42 and 44. Alternatively, the relative positions of the dummy electrode 52 and the terminal electrodes of the second circuit board 44 in the first and second directions may be determined in an optical way using the plurality of openings 58 (for example, the center points of the plurality of openings 58) as the reference. Based on the determined relative positions, the first circuit board 42 and the second circuit board 44 may be aligned with each other in the first and second directions. The relative positions may otherwise be determined using the center points of inter-opening regions of the dummy electrode 52 located between the adjacent openings 58 as the reference.

Figure 10:
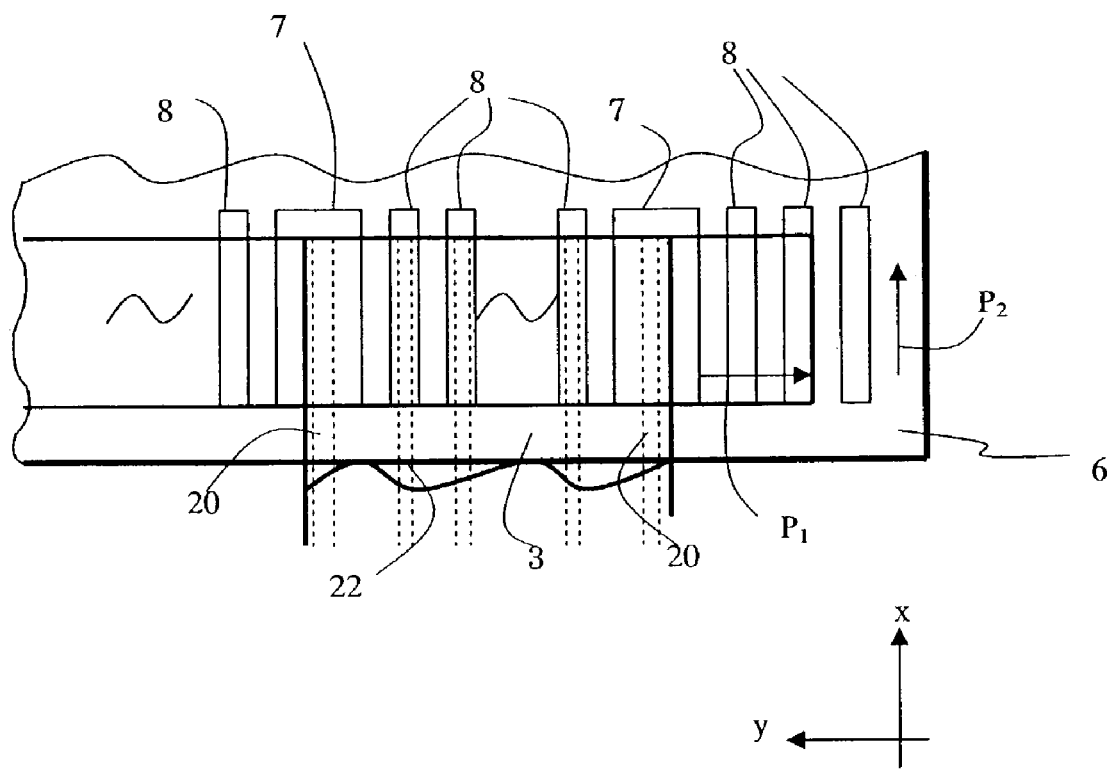
FIG. 10 is a partial plan view of the circuit board and the flexible printed wiring board of the liquid crystal display device of FIG. 8.

The alignment of two circuit boards in the first and second directions as described above can provide higher precision than the alignment only in the pitch direction P1 in the conventional connection structure shown in FIG. 10. Each of the openings 58 of the dummy electrode 52 preferably has a side parallel to the first direction and a side parallel to the second direction, to enable easy determination of the relative positions described above and thus easy alignment of the circuit boards. The alignment in an optical way will be described later in detail in relation to the method for forming a circuit board connection structure according to the present invention.

As the dummy electrode 52, it is also possible to use one having a plurality of openings 58 arranged in a matrix in the first direction and a second direction substantially perpendicular to the first direction. Using the dummy electrode 52 of this shape, also, the relative positions described above can be easily determined. In addition, when a thermosetting material is used for the conductive resin layer 46, the conductive resin easily enters the openings 58 from the surface of the dummy electrode 52 during heating for setting of the conductive resin. Therefore, the conductive resin layer 46 can be formed uniformly to a sufficient thickness, and thus the in-plane adhesion strength of the conductive resin layer 46 can be made uniform. If the plurality of openings 58 are formed to have an identical shape and size, the thickness of the conductive resin layer 46 can be made further uniform.

The conductive resin layer 46 is formed so that a first side 45 extends in the first direction and a second side 47 extends in the second direction substantially perpendicular to the first direction, for example. As shown in FIG. 1A, preferably, the first side 45 crosses the plurality of first terminal electrodes 48 and the second side 47 is located on the dummy electrode 52. In general, the conductive resin layer 46 tends to separate starting from a side (edge) thereof. Since the sides 45 and 47 of the conductive resin layer 46 are placed as described above, these sides are in contact with the board 42 and the electrodes 48 or 52, and this increases the adhesion area. As a result, the conductive resin layer 46 can be made more resistant to separating, compared with a case that the conductive resin layer 46 completely covers the terminal electrodes 48 and the dummy electrode 52 and the entire periphery of the conductive resin layer 46 is in contact with the board 42.

Preferably, at least part of a periphery 59 of the dummy electrode 52 has a concave and convex shape as shown in FIG. 1A, and the first side 45 of the conductive resin layer 46 crosses the concave and convex shaped periphery 59. This increases the adhesion area in the vicinity of the first side 45 of the conductive resin layer 46 located on the dummy electrode 52, and thus the conductive resin layer 46 can be made resistant to separating.

The concave and convex shape of the periphery 59 is also useful for the alignment between the first circuit board 42 and the second circuit board 44. The relative positions in the first and second directions of the dummy electrode 52 and the terminal electrodes of the second circuit board 44 may be determined in an optical way using the concave and convex shape and placement of the periphery 59 (for example, the center points of the concave or convex portions) as the reference, for example, in the process of bonding between the first and second circuit boards 42 and 44. Based on the determined relative positions, the first circuit board 42 and the second circuit board 44 may be aligned with each other in the first and second directions. In this case, also, the alignment of the first and second circuit boards 42 and 44 in the first and second directions can provide higher precision than the conventional alignment.

Although not shown in FIGS. 1A and 1B, the dummy electrode 52 may be provided with a misalignment check mark, which may be an opening large enough to be visually recognizable placed at a predetermined position on the dummy electrode 52, for example. Using this mark as a reference, it is possible to align the first circuit board 42 and the second circuit board 44 with each other visually or in an optical way during the bonding between the first and second circuit boards 42 and 44.

Next, a circuit board connection structure according to the second aspect of the present invention will be described with reference to FIGS. 2A to 2C.

Figure 2A:
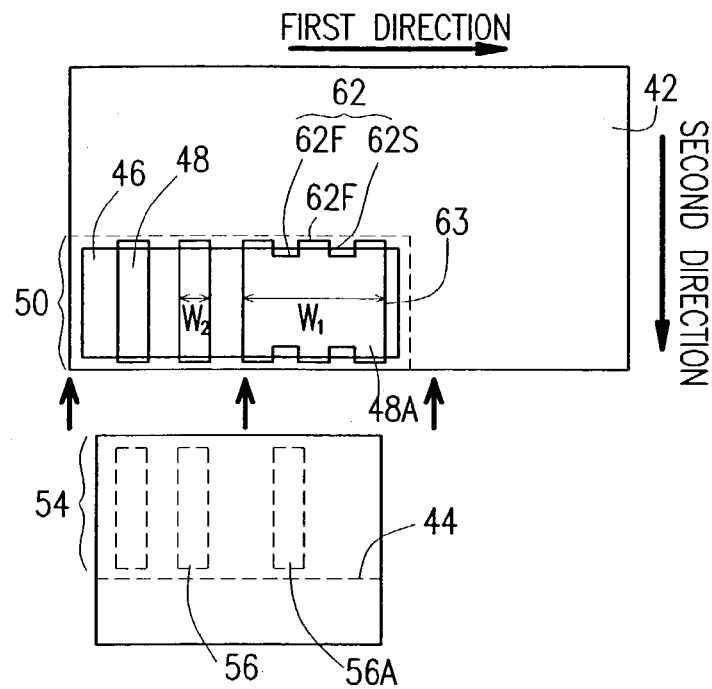
FIGS. 2A to 2C are diagrammatic plan views of a circuit board connection structure according to the second aspect of the present invention.

As shown in FIG. 2A, one feature of the circuit board connection structure according to the second aspect of the present invention is that, among the plurality of first terminal electrodes 48 formed in the first terminal region 50 of the first circuit board 42, an outermost first terminal electrode 48A has a first side 62 having a concave and convex shape extending in the first direction. Using the first side 62 of the outermost first terminal electrode 48A, it is possible to align the first and second circuit boards 42 and 44 with each other with high precision in the formation of the circuit board connection structure.

To state more specifically, the relative positions of the outermost first terminal electrode 48A of the first circuit board 42 and an outermost second terminal electrode 56A of the second circuit board 44 in the first direction and in the second direction substantially perpendicular to the first direction are determined in an optical way using the concave and convex shape of the first side 62 as the reference. Based on the determined relative positions, the first circuit board 42 and the second circuit board 44 can be aligned with each other in the first and second directions. The alignment of the two circuit boards in the first and second directions as described above can provide higher precision than the alignment only in the pitch direction P1 in the conventional connection structure shown in FIG. 10. This can enhance the reliability of the electrical connection between the first and second circuit boards 42 and 44.

The outermost first terminal electrode 48A shown in FIG. 2A has second sides 63 extending in the second direction substantially perpendicular to the first direction. The distance between the two opposite second sides 63, that is, the width W1 of the outermost first terminal electrode 48A, is preferably greater than the width W2 in the first direction of the plurality of first terminal electrodes 48 other than the outermost first terminal electrode 48A. For example, when the thermal conductivity of the second circuit board 44 is greater than that of the first circuit board 42, the second circuit board 44 is cooled more easily during cooling after the heating for setting of the conductive resin layer 46. Therefore, a portion of the conductive resin layer 46 existing in a region corresponding to an edge of the second circuit board 44 tends to separate, and as a result, faulty electrical connection tends to occur. In this occasion, if the width W1 of the outermost first terminal electrode 48A is large, a large area can be secured for the electrical connection between the outermost first terminal electrode 48A and the conductive resin layer 46, and thus occurrence of faulty electrical connection can be suppressed.

As shown in FIG. 2A, the concave and convex shaped first side 62 of the outermost first terminal electrode 48A preferably has a plurality of third sides 62F parallel to the first direction and a plurality of fourth sides 62S parallel to the second direction. By forming the first side 62 in this way, it is possible to easily determine the relative positions of the concave and convex shape of the first side 62 and the outermost second terminal electrode 56A in the first and second directions, and thus the alignment can be facilitated.

Figure 2B:
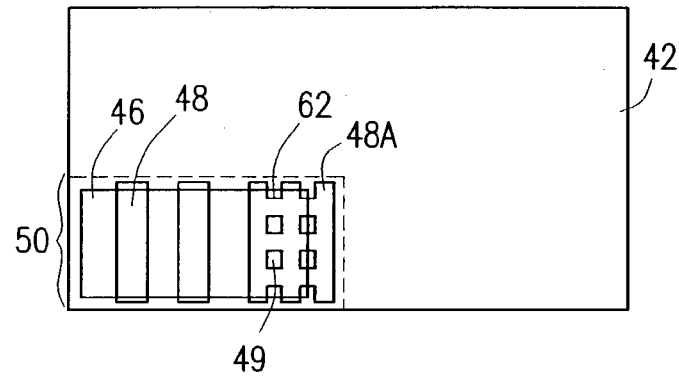

In the circuit board connection structure according to the second aspect of the present invention, the outermost first terminal electrode 48A may have a plurality of openings 49 as shown in FIG. 2B. By having the plurality of openings 49, the adhesion area of the conductive resin applied to the outermost first terminal electrode 48A can be increased, and this can prevent the conductive resin layer 46 from separating, as in the case of the dummy electrode 52 shown in FIG. 1A. Moreover, the plurality of openings 49 can be used for alignment between the first and second circuit boards 42 and 44. This alignment can be performed in the manner described above with reference to the alignment using the dummy electrode 52 shown in FIGS. 1A and 1B. This alignment may be combined with the alignment performed using the first side 62 of the outermost first terminal electrode 48A as the reference described above, or may be performed by itself in place of the alignment using the first side 62 as the reference.

In the case of using the plurality of openings 49 for alignment, the openings 49 are preferably arranged in the first direction and the second direction substantially perpendicular to the first direction. Each of the openings 49 preferably has a side parallel to the first direction and a side parallel to the second direction. The openings 49 are also preferably arranged in a matrix in the first and second directions. The plurality of openings 49 preferably have an identical shape and size, so that the thickness of the conductive resin layer 46 is made more uniform.

As described above, the outermost first terminal electrode 48A having a plurality of openings 49 can be used, not only as a terminal electrode for outputting an electric signal from an element mounted on the circuit board 42, but also for prevention of separating of the conductive resin layer 46 and/or alignment of the circuit boards.

Figure 2C:
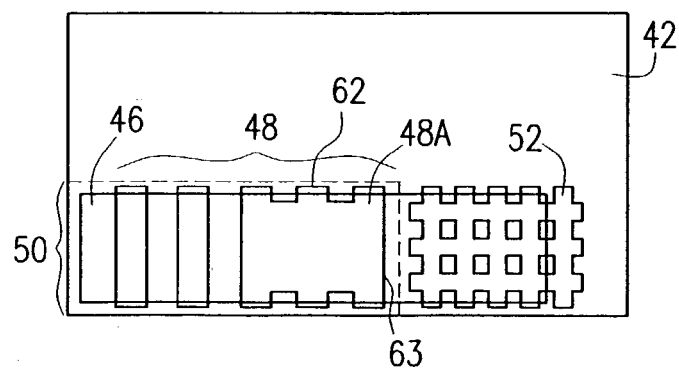

As shown in FIG. 2C, a dummy electrode 52 may be formed on the circuit board 42 shown in FIG. 2A. The dummy electrode 52 shown in FIG. 2C, which is substantially the same as the dummy electrode 52 used in the connection structure shown in FIGS. 1A and 1B, is placed next to the first terminal region 50 in the first direction. With provision of the dummy electrode 52, the conductive resin layer 46 can be made more resistant to separating as described in relation with the connection structure shown in FIGS. 1A and 1B.

Next, a circuit board connection structure according to the third aspect of the present invention will be described with reference to FIG. 2D.

Figure 2D:
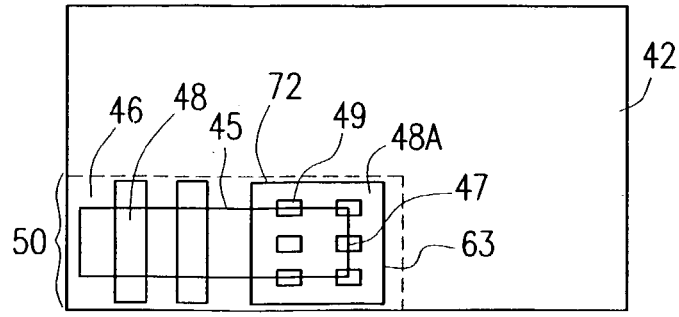
FIG. 2D is a diagrammatic plan view of a circuit board connection structure according to the third aspect of the present invention.

As shown in FIG. 2D, one feature of the circuit board connection structure according to the third aspect of the present invention is that, among the plurality of first terminal electrodes 48 formed in the first terminal region 50 of the first circuit board 42, the outermost first terminal electrode 48A has a plurality of openings 49. Using the plurality of openings 49 of the outermost first terminal electrode 48A, it is possible to prevent separating of the conductive resin layer 46 and also align the first and second circuit boards with each other. Unlike the circuit board connection structure according to the second aspect described above, the first side of the outermost first terminal electrode 48A extending in the first direction may be of any shape. For example, as shown in FIG. 2D, a first side 72 of the outermost first terminal electrode 48A is parallel to the first direction.

The alignment between the first and second circuit boards during the formation of the circuit board connection structure is performed in the following manner, for example.

First, the placement of the plurality of openings 49 of the outermost first terminal electrode 48A is optically detected, and the relative positions of the outermost first terminal electrode 48A and the outermost second terminal electrode with each other are determined based on an optical pattern obtained. More specifically, the center points of the plurality of openings 49 are detected by subjecting the optical pattern to image processing and the like, and using the plurality of center points as the reference, the relative positions can be determined. In place of the center points of the openings 49, the center points of inter-opening regions of the outermost first terminal electrode 48A located between the adjacent openings 49 may be used as the reference. Based on the determined relative positions, the first circuit board 42 and the second circuit board 44 are aligned with each other in the first and second directions.

Alternatively, by arranging the plurality of openings 49 in the first direction and the second direction perpendicular to the first direction as shown in FIG. 2D, the sides of the second circuit boards 44 parallel to the first direction and the second direction may be made to match with a row of the openings 49 arranged in the first direction and a row of the openings 49 arranged in the second direction, respectively, and in this way, the both circuit boards can be aligned with each other. For easy determination of the relative positions, each of the openings 49 preferably has a side parallel to the first direction and a side parallel to the second direction. Also, the openings 49 are preferably arranged in a matrix in the first and second directions.

As described above, in the circuit board connection structure according to the third aspect, as in the circuit board connection structures according to the first and second aspects described above, in which the alignment in both the first and second directions is allowed, the two circuit boards can be aligned with each other with high precision, and this can enhance the reliability of the electrical connection between the first circuit board 42 and the second circuit board 44.

For more effective prevention of separating of the conductive resin layer 46, the circuit board connection structure according to the third aspect is preferably constructed as follows.

At least part of the first side 45 of the conductive resin layer 46 extending in the first direction is preferably placed inside at least one opening among the plurality of openings 49, and at least part of the second side 47 extending in the second direction is preferably placed inside at least one opening among the plurality of openings 49. By this placement, the conductive resin layer 46 are in contact with the portions of the board 42 exposed through the openings 49 and the walls of the openings 49 in the vicinity of the sides 45 and 47, and this increases the adhesion area. With the increased adhesion area, the conductive resin layer 46 becomes more resistant to separating.

The plurality of openings 49 preferably have an identical shape and size, so that the thickness of the conductive resin layer 46 can be made more uniform. As described above in relation to the outermost first terminal electrode 48A shown in FIG. 2A, the distance W1 between the two opposite second sides 63 of the outermost first terminal electrode 48A is preferably greater than the width W2 in the first direction of the plurality of first terminal electrodes 48 other than the outermost first terminal electrode 48A.

Although not illustrated specifically, the dummy electrode 52 may be formed next to the outermost first terminal electrode 48A in the first direction, as in FIG. 2C, for further prevention of separating of the conductive resin layer 46.

Figure 3A:
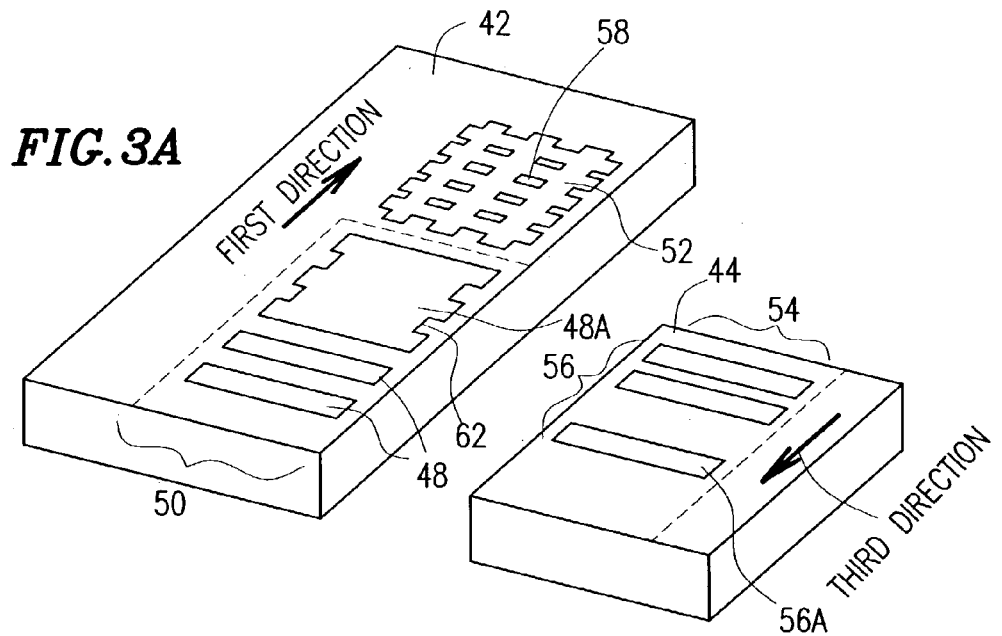
FIGS. 3A to 3C are perspective views demonstrating a method for forming a circuit board connection structure of the present invention.
Figure 3B:
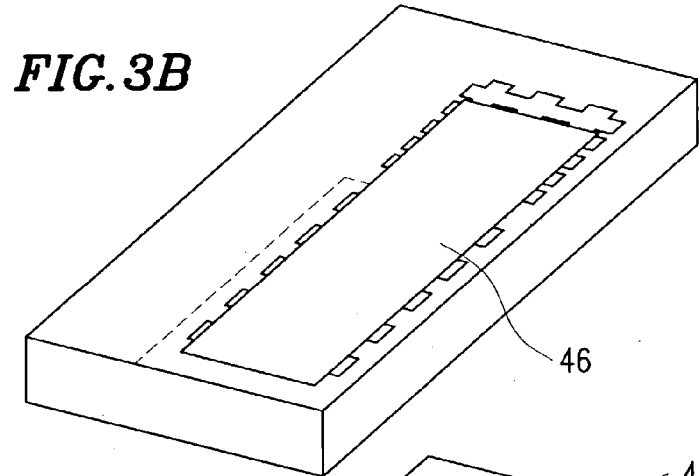
Figure 3C:
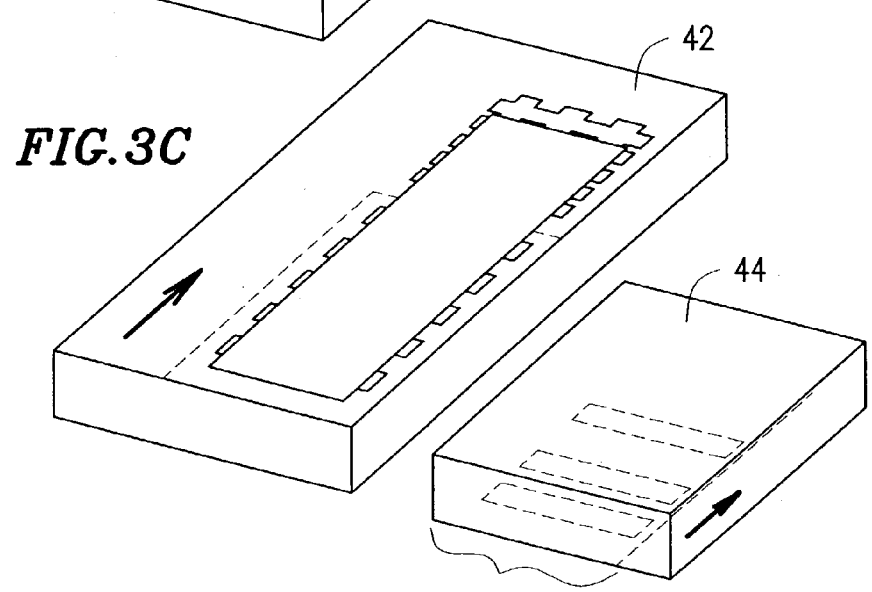

Hereinafter, a method for forming a circuit board connection structure of the present invention will be described with reference to FIGS. 3A to 3C. FIGS. 3A to 3C schematically illustrate the process of this formation method. Note that the formation method will be described using the circuit board shown in FIG. 2C as the first circuit board 42, as an example.

The method for forming a circuit board connection structure of the present invention includes the process steps of: preparing first and second circuit boards; forming a conductive resin layer; determining the positions of the circuit boards; aligning the circuit boards with each other; and bonding the circuit boards together, which will be described in detail as follows.

First, as shown in FIG. 3A, the first circuit board 42 and the second circuit board 44 are prepared. The first circuit board 42 has the first terminal region 50 including the plurality of first terminal electrodes 48 arranged in the first direction and the dummy electrode 52 placed next to the region 50 in the first direction. The dummy electrode 52 is provided, not for electrical connection, but for making the conductive resin layer 46 to be formed on the board 42 in a later process step more resistant to separating. The dummy electrode 52 may be formed simultaneously with the formation of the first terminal electrodes 48 by patterning the same metal layer, but does not serve as a terminal for output of a signal from an element mounted on the first circuit board 42 and therefore has no electrical connection with any elements.

The second circuit board 44 has the second terminal region 54 including the plurality of second terminal electrodes 56 arranged in a third direction.

Thereafter, as shown in FIG. 3B, the conductive resin layer 46 is formed on the first circuit board 42 so as to cover at least part of each of the plurality of first terminal electrodes 48 and at least part of the dummy electrode 52.

As shown in FIG. 3C, the second terminal region 54 is placed to face the first terminal region 50 via the conductive resin layer 46 so that the first direction and the third direction are parallel to each other. The relative positions of the outermost first terminal electrode 48A and the outermost second terminal electrode 56A are optically determined using the concave and convex shape of the first side 62 of the outermost first terminal electrode 48A as the reference.

Hereinafter, an example of optical determination of the relative positions will be described.

Images of the first and second circuit boards 42 and 44 are taken with an image pickup device such as a CCD, for example. The resultant optical patterns are subjected to image processing, to obtain the difference between the reflectivity of the region of the first circuit board 42 other than the outermost first terminal electrode 48A and the reflectivity of the outermost first terminal electrode 48A and the difference between the reflectivity of the region of the second circuit board 44 other than the outermost second terminal electrode 56A and the reflectivity of the outermost second terminal electrode 56A. Using these differences obtained, the relative positions of the outermost first terminal electrode 48A and the outermost second terminal electrode 56A are determined.

To state more specifically, the center points of the plurality of concave or convex portions of the first side 62 of the outermost first terminal electrode 48A may be detected, for example, and the relative positions may be determined using the plurality of center points as the reference. Because the first side 62 has a concave and convex shape, the relative positions can be determined in the first and second directions.

Note that in the case that the outermost first terminal electrode 48A has a plurality of openings 49 (FIG. 2D) and the alignment is performed using the openings 49, the difference between the reflectivity of the portions of the first circuit board 42 exposed through the openings 49 and the reflectivity of the region of the outermost first terminal electrode 48A other than the openings 49 and the difference between the reflectivity of the region of the second circuit board 44 other than the outermost second terminal electrode 56A and the reflectivity of the outermost second terminal electrode 56A are obtained. Using these differences obtained, the relative positions of the outermost first terminal electrode 48A and the outermost second terminal electrode 56A are determined.

To state more specifically, the center points of the plurality of openings 49 or the center points of inter-opening regions of the outermost first terminal electrode 48A located between the adjacent openings 49 may be detected, and the relative positions may be determined using the plurality of center points as the reference.

After the determination of the relative positions in the manner described above, the first circuit board 42 and the second circuit board 44 are aligned with each other based on the determined relative positions. The alignment of the two circuit boards based on the relative positions determined in the first and second directions can provide higher precision compared with the conventional connection structure shown in FIG. 10 in which the alignment is performed only in the pitch direction P1. This can enhance the reliability of the electrical connection between the first and second circuit boards 42 and 44.

Thereafter, the first circuit board 42 and the second circuit board 44 are bonded together by setting the conductive resin layer 46. Since the conductive resin adhesive enters the plurality of openings 58 formed on the dummy electrode 52, the conductive resin layer 46 comes into contact with the portions of the surface of the board exposed through the openings 58, the walls of the openings 58 and the surface of the dummy electrode 52. Therefore, the conductive resin layer 46 becomes more resistant to separating.

By following the process described above, the circuit board connection structure of the present invention is completed.

Figure 8:
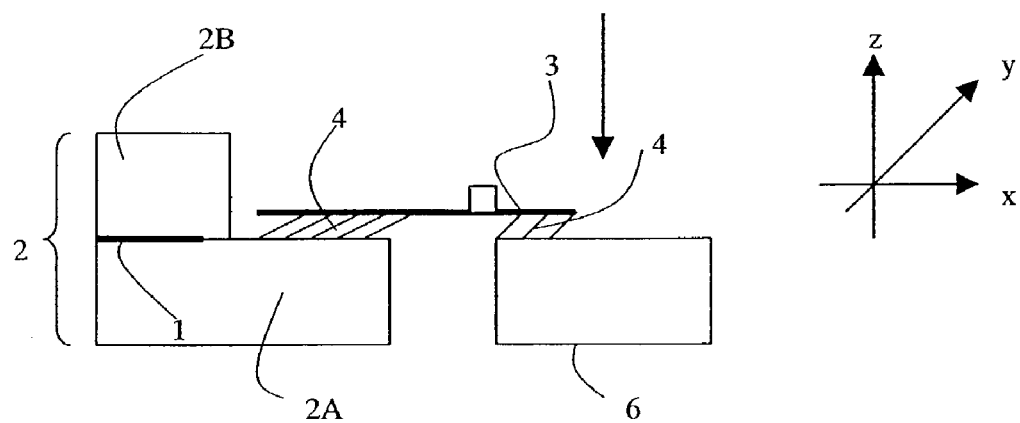
FIG. 8 is a cross-sectional view of a conventional active matrix liquid crystal display device.

Hereinafter, examples according to the present invention will be described. In the examples to follow, the present invention is applied to an active matrix liquid crystal display device constructed as shown in FIG. 8. Note however that the present invention is not limited to this application, but can be suitably applied to various types of display devices and the like.

EXAMPLE 1

Figure 4A:
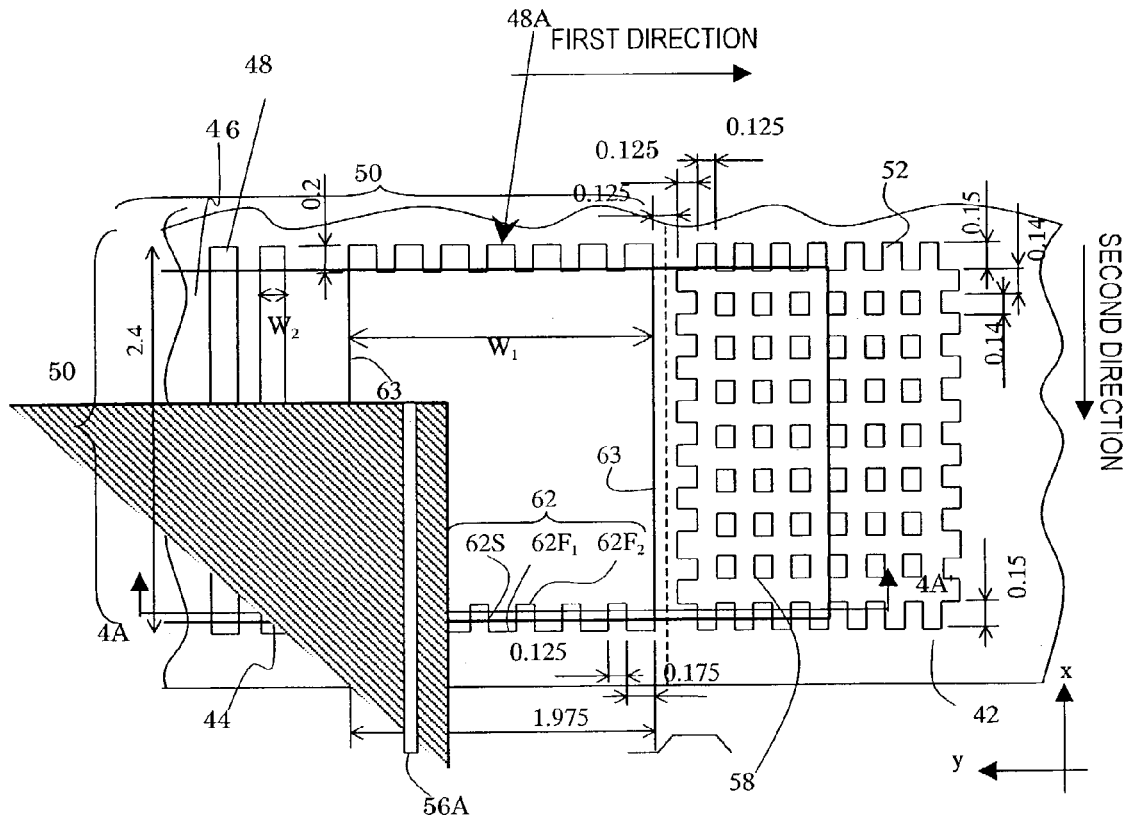
FIG. 4A is a plan view of a circuit board connection structure of Example 1 of the present invention.
Figure 4B:
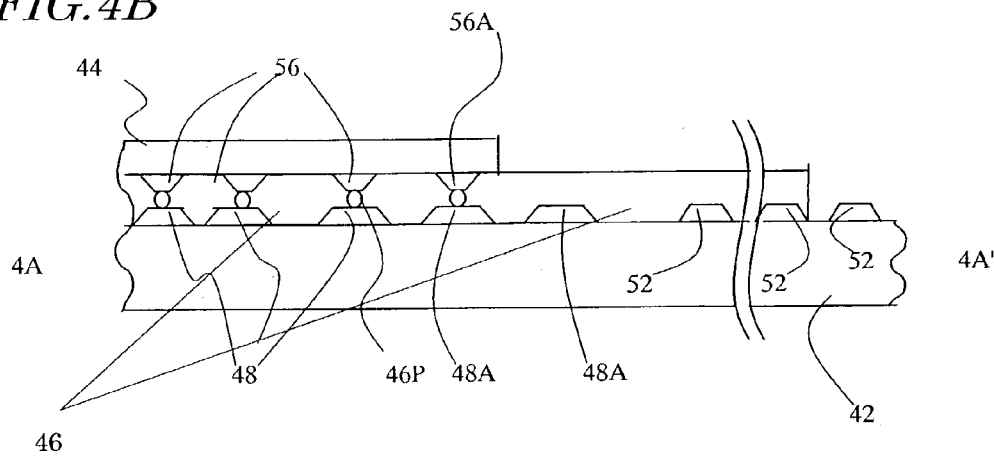
FIG. 4B is a cross-sectional view taken along line 4A–4A' of FIG. 4A.

Example 1 will be described with reference to FIGS. 4A and 4B. FIG. 4A is a plan view of the liquid crystal display device shown in FIG. 8, viewed in the direction of the arrow in FIG. 8. FIG. 4B is a cross-sectional view taken along line 4A–4A' of FIG. 4A.

As shown in FIG. 4A, a circuit board (first circuit board) 42 has, on its major surface, a first terminal region 50 including a plurality of terminal electrodes 48 and a dummy electrode 52 placed next to the first terminal region 50 in the first direction. The terminal electrodes 48 formed in the first terminal region 50 include a plurality of stripe first terminal electrodes 48 and an outermost first terminal electrode 48A located outermost in the first direction The outermost first terminal electrode 48A is greater in line width than the stripe first terminal electrodes 48, and the two opposite sides 62 thereof extending in the first direction have a concave and convex shape. To state more specifically, the width W1 of the outermost first terminal electrode 48A in the first direction is greater than the width W2 of the first terminal electrodes 48, and the two sides 62 of the outermost first terminal electrode 48A extending in the first direction have a concave and convex shape that is composed of side portions 62F1 and 62F2 extending in the first direction and side portions 62S extending in the second direction perpendicular to the first direction formed continuously.

The dummy electrode 52 is formed next to the outermost first terminal electrode 48A in the first direction. The dummy electrode 52 has a pattern of openings in a mesh shape. More specifically, the dummy electrode 52 has a periphery of a concave and convex shape and has a plurality of openings 58 inside. The plurality of openings 58, having the same rectangular shape of the same size, are arranged in a matrix in the first and second directions. The dummy electrode 52 is not necessarily of the mesh shape described above, but the openings 58 may have a shape of a cross, a cycle (including an oval) or the like as long as the adhesion area of a conductive resin layer 46 can be increased with the openings.

The circuit board 42 may be a printed circuit board, for example. All of the terminal electrodes 48, the outermost terminal electrode 48A and the dummy electrode 52 are formed of same copper foil on the major surface of the circuit board 42. The surface of the copper foil is covered with a protection film (resist) except for the region to be connected with terminal electrodes 56 of a flexible printed wiring board 44 with which the circuit board 42 is to be bonded.

The flexible printed wiring board (second circuit board) 44 has a second terminal region including a plurality of second terminal electrodes arranged in the first direction. Note that in FIG. 4A, only an outermost second terminal electrode 56A located outermost in the first direction is shown among the plurality of second terminal electrodes.

The circuit board 42 and the flexible printed wiring board 44 are bonded together with the conductive resin layer 46. The conductive resin layer 46 is formed to cover the first terminal electrodes 48, the outermost first terminal electrode 48A and the dummy electrode 52 partly. To state more specifically, the conductive resin layer 46 is formed so that a side thereof extending in the first direction crosses the sides of the first terminal electrodes 48 and the outermost first terminal electrode 48A extending in the second direction and also crosses part of the concave and convex shaped periphery of the dummy electrode 52. The conductive resin layer 46 is also formed so that a side thereof extending in the second direction is located on the dummy electrode 52.

Figure 9:
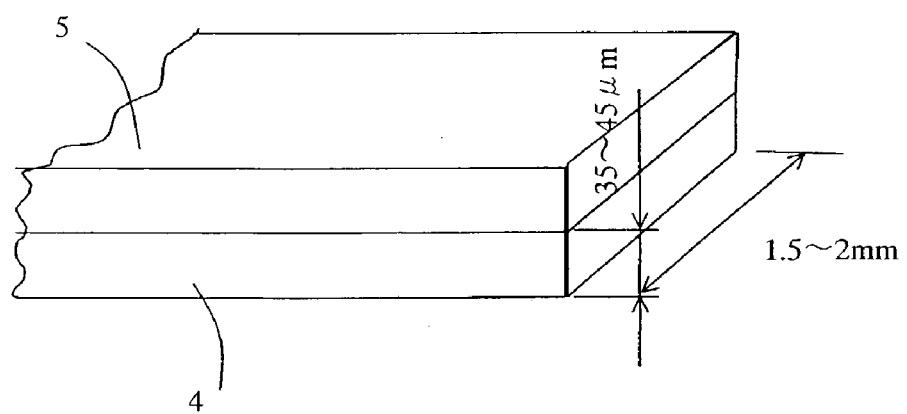
FIG. 9 is a perspective view of a conductive adhesive used for bonding between a circuit board and a flexible printed wiring board.

In this example, an ACF having the structure shown in FIG. 9 is used, which is composed of the ACF layer (conductive resin layer) 4 and the separator 5. The separator 5, made of polyethylene terephthalate (PET), for example, is finally peeled off and removed from the ACF layer. As shown in FIG. 4B, the conductive resin layer 46 as the ACF layer includes anisotropic conductive particles 46P dispersed in the epoxy resin that is a thermosetting resin. The conductive resin layer 46 is not necessarily made of the ACF, but may be made of an arbitrary material as long as the material has both electrical conductivity and adhesiveness.

The circuit board 42 and the flexible printed wiring board 44 are bonded together with the conductive resin layer 46 as described above. Simultaneously, the respective terminal electrodes 48 of the circuit board 42 are electrically connected with the corresponding terminal electrodes 56 of the flexible printed wiring-board 44, and the outermost terminal electrode 48A of the circuit board 42 is electrically connected with the outermost terminal electrode 56A of the flexible printed wiring board 44.

An example of a method for connecting the circuit boards described above will be described.

First, prepared is the circuit board 42 (size: 50 mm×350 mm, thickness: 0.5 mm) having the first terminal electrodes 48, the outermost first terminal electrode 48A and the dummy electrode 52 described above formed on the major surface thereof. Also prepared is the flexible printed wiring board 44 having the second terminal electrodes 56 and the outermost second terminal electrode 56A formed on the major surface thereof.

Details of the sizes of the first terminal electrodes and the dummy electrode of the circuit board 42 are as follows.

Line width W2 of the first terminal electrodes 48: 0.2 mm

Line width W1 of the outermost first terminal electrode 48A: 1.975 mm

Length of the side portion 62F1 of the side 62 of the outermost first terminal electrode 48A extending in the first direction: 0.175 mm Length of the side portion 62F2 of the side 62 of the outermost first terminal electrode 48A extending in the first direction: 0.125 mm Length of the side portion 62S of the side 62 of the outermost first terminal electrode 48A extending in the second direction: 0.2 mm Length of the side of the openings 58 of the dummy electrode 52 extending in the first direction: 0.125 mm Length of the side of the openings 58 of the dummy electrode 52 extending in the second direction: 0.14 mm Length between the adjacent openings 58 of the dummy electrode 52 in the first direction: 0.125 mm Length between the adjacent openings 58 of the dummy electrode 52 in the second direction: 0.14 mm Length of the side portion of the periphery of the dummy electrode 52 in the second direction: 0.15 mm Thereafter, the ACF shown in FIG. 9 is placed on the circuit board 42 so as to cover the first terminal electrodes 48, the outermost first terminal electrode 48A and the dummy electrode 52 partly. More specifically, the ACF is placed so that a side thereof parallel to the second direction is located on the dummy electrode 52 and that a side thereof parallel to the first direction crosses the periphery of the dummy electrode 52.

Subsequently, the ACF is subjected to temporary press bonding to the circuit board 42 with a tool for temporary press bonding, and the separator is peeled off. The temporary press bonding was performed with the tool set at 80° C. for three seconds under a pressure of 1 Mpa. In this way, only the conductive resin layer (ACF layer) 46 of the ACF is transferred (temporarily adheres) to the circuit board 42.

Since the dummy electrode 52 has the plurality of openings 58, the conductive resin enters the openings 58 from the surface of the dummy electrode 52 during the temporary press bonding. Therefore, the conductive resin is in contact with the surface of the dummy electrode 52, the portions of the surface of the board 42 exposed through the openings 58, and the walls of the openings 58. In addition, since an edge of the ACF layer 46 extends crossing the concave and convex shaped periphery of the dummy electrode 52, the edge of the ACF layer 46 is allowed to be in contact with both the board 42 and the dummy electrode 52. Moreover, since the openings 58 having the same shape are arranged in a matrix, the conductive resin layer 46 having a sufficient and uniform thickness can be easily obtained. In this way, it is possible to form the conductive resin layer 46 with uniform adhesive strength.

Thereafter, the circuit board 42 and the flexible printed wiring board 44 are aligned with each other so that the terminal electrodes of the circuit board 42 are connected with the corresponding terminal electrodes of the flexible printed wiring board 44. For this alignment, the relative positions of the outermost first terminal electrode 48A and the outermost second terminal electrode 56A are optically determined. This determination of the relative positions can be performed automatically with a position detecting system including an image pickup device and an image processor. The image pickup device is, for example, a charge coupled device (CCD), a reflective sensor, and other types of sensor.

An example of the position determination will be described. Images of the circuit board 42 and the flexible printed wiring board 44 are taken with an image pickup device using a light source. Based on the images taken, the side portions 62S and 62F1 of the outermost first terminal electrode 48A are detected using an image processor. The outermost second terminal electrode 56A is also detected. From the detected results, the relative positional relationship between the outermost first terminal electrode 48A and the outermost second terminal electrode 56A is calculated.

In the position determination described above, an edge of the outermost second terminal electrode 56A and the concave and convex shape of the outermost first terminal electrode 48A were used. Alternatively, terminal electrodes similar to the outermost first terminal electrode 48A and the outermost second terminal electrode 56A may also be formed at the outermost position of the circuit board 42 and the flexible printed wiring board 44 in the direction opposite to the first direction, and the position determination described above may also be performed for these terminal electrodes.

Based on the calculated results of the position determination described above, the difference in the center position between the circuit board 42 and the flexible printed wiring board 44 is calculated, and by correcting the difference, the circuit board 42 and the flexible printed wiring board 44 are aligned with each other.

As described above, automatic alignment is possible using the position detecting system, and moreover, the alignment is performed in both the first and second directions. Therefore, the circuit board 42 and the flexible printed wiring board 44 can be aligned with each other efficiently with high precision.

Thereafter, the terminal electrodes of the flexible printed wiring board 44 are placed on the conductive resin layer 46, and then the conductive resin layer 46 is subjected to final press bonding with a tool for final press bonding. The final press bonding was performed with the tool set at 200° C. for 12 seconds under a pressure of 3 Mpa. With this press, the conductive resin layer 46 is set to thereby complete the circuit board connection structure of this example.

EXAMPLE 2

Figure 5:
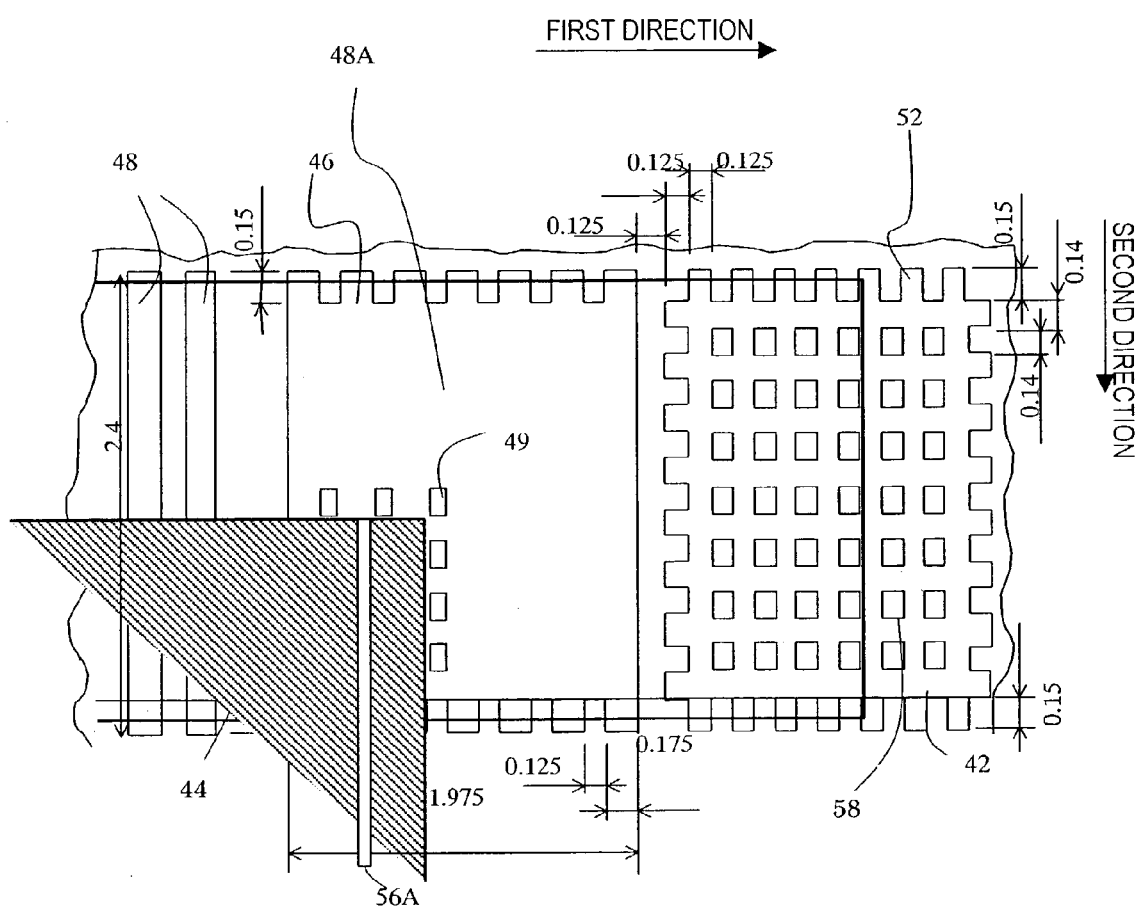
FIG. 5 is a plan view of a circuit board connection structure of Example 2 of the present invention.

A circuit board connection structure of Example 2 will be described with reference to FIG. 5.

The circuit board connection structure of Example 2 is different from the circuit board connection structure of Example 1 in that the outermost first terminal electrode 48A has a plurality of openings 49. The openings 49 are used for the alignment of the flexible printed wiring board 44 with the circuit board 42. In Example 2, the openings 49 are rectangular and arranged in the first and second directions in a predetermined area. The shape of the openings 49 is not limited to this, but may be a cross.

In this example, the alignment is performed so that a side of the flexible printed wiring board 44 parallel to the first direction matches with a row of the openings 49 arranged in the first direction, and that a side of the flexible printed wiring board 44 parallel to the second direction matches with a row of the openings 49 arranged in the second direction. By this alignment, the corresponding terminal electrodes on the boards 42 and 44 are electrically connected with each other. This alignment is easy because it can be performed visually.

The visual alignment of the circuit board 42 and the flexible printed wiring board 44 described above may be performed by itself, or in combination with the optical alignment described in Example 1. For example, after rough visual alignment between the first and second circuit boards 42 and 44, the higher-precision optical alignment described in Example 1 may be performed. This enables high-precision alignment between the first and second circuit boards.

Like the openings 58 of the dummy electrode 52, the openings 49 of the outermost first terminal electrode 48A can also be used for prevention of separating of the conductive resin layer 46.

EXAMPLE 3

Figure 6:
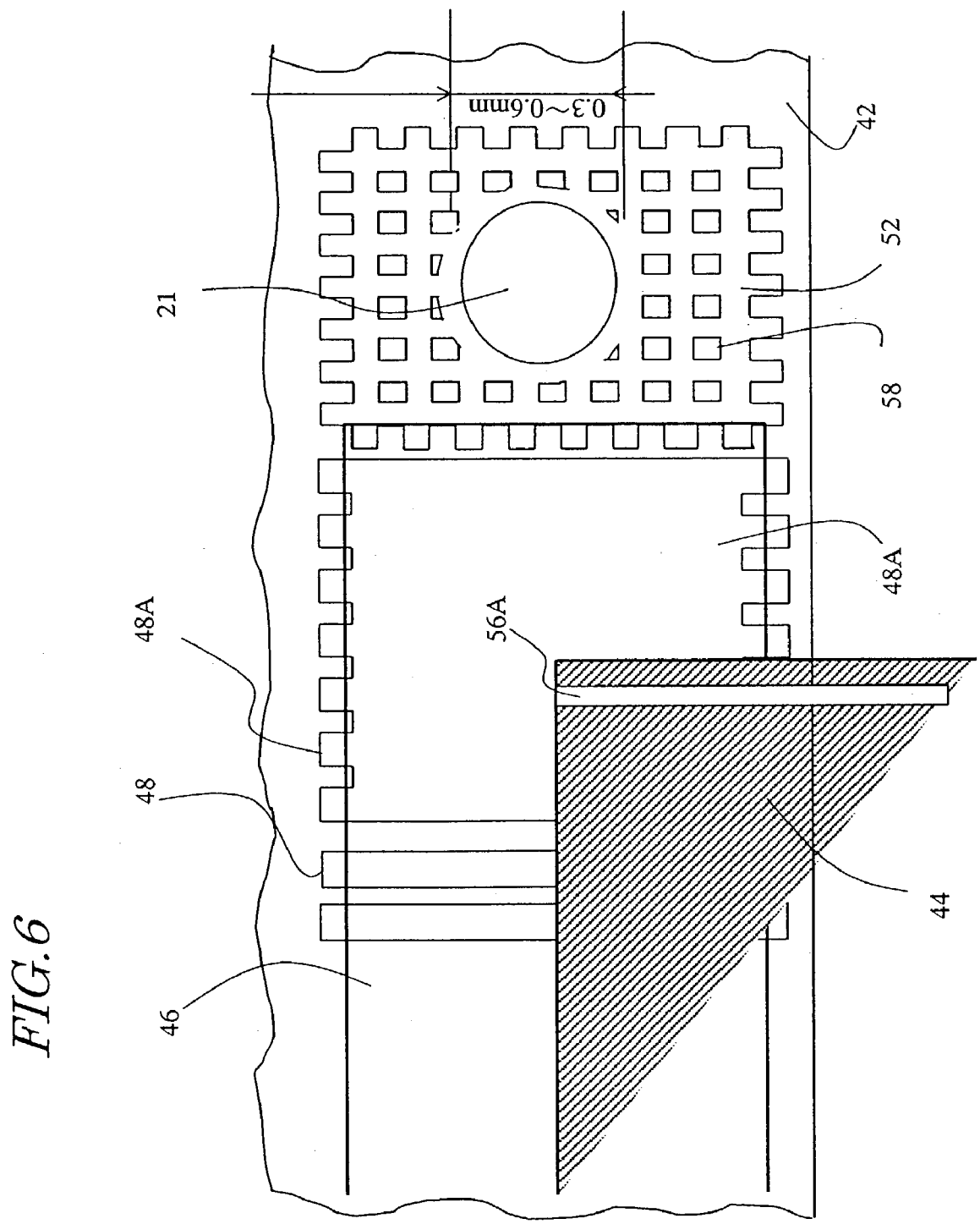
FIG. 6 is a plan view of a circuit board connection structure of Example 3 of the present invention.

A circuit board connection structure of Example 3 will be described with reference to FIG. 6.

The circuit board connection structure of Example 3 is different from the circuit board connection structure of Example 1 in that the dummy electrode 52 has a misalignment check mark 21. In Example 3 shown in FIG. 6, the misalignment check mark 21 is a circular opening having a diameter of 0.3 mm.

In this example, the alignment between the circuit board 42 and the flexible printed wiring board 44 is performed in the following manner. The misalignment check mark 21 of the circuit board 42 is displayed on a monitor, for example. Simultaneously, a reference region in which a terminal electrode of the flexible printed wiring board 44 can be placed with respect to the misalignment check mark 21 is also displayed. An image of the terminal electrode 56A of the flexible printed wiring board 44 is taken with a CCD camera and displayed on the monitor. The flexible printed wiring board 44 is moved through observation with the monitor, and in this way, the flexible printed wiring board 44 is positioned in the reference region.

As described above, in this example, as in Example 2, a misalignment between the terminal electrodes of the circuit board 42 and the flexible printed wiring board 44 can be easily observed visually by the operator without use of a detection apparatus.

In addition, a misalignment of temporary press bonding of the ACF to the terminal electrodes of the circuit board 42 can be easily detected visually by the operator. This can reduce the fabrication yield and the fabrication cost.

The diameter of the misalignment check mark 21 is not limited to 0.3 mm, but may be any value as long as the operator can recognize the mark visually and may be determined according to the size of the dummy electrode 52. The visual alignment in this example may be combined with the optical alignment in Example 1, as described in Example 2. In this combination, the center coordinates of the misalignment check mark 21 may be determined by image processing, and the relative positions of the circuit board 42 and the flexible printed wiring board 44 may be calculated using the center coordinates, to be used for the alignment of the two boards.

EXAMPLE 4

A circuit board connection structure of Example 4 will be described with reference to FIG. 7. The circuit board 42 in Example 4 is connected with a plurality of flexible printed wiring boards 44A and 44A' arranged in the direction of placement of the first terminal electrodes 48 (direction shown by arrow 7A in FIG. 7).

Figure 7:
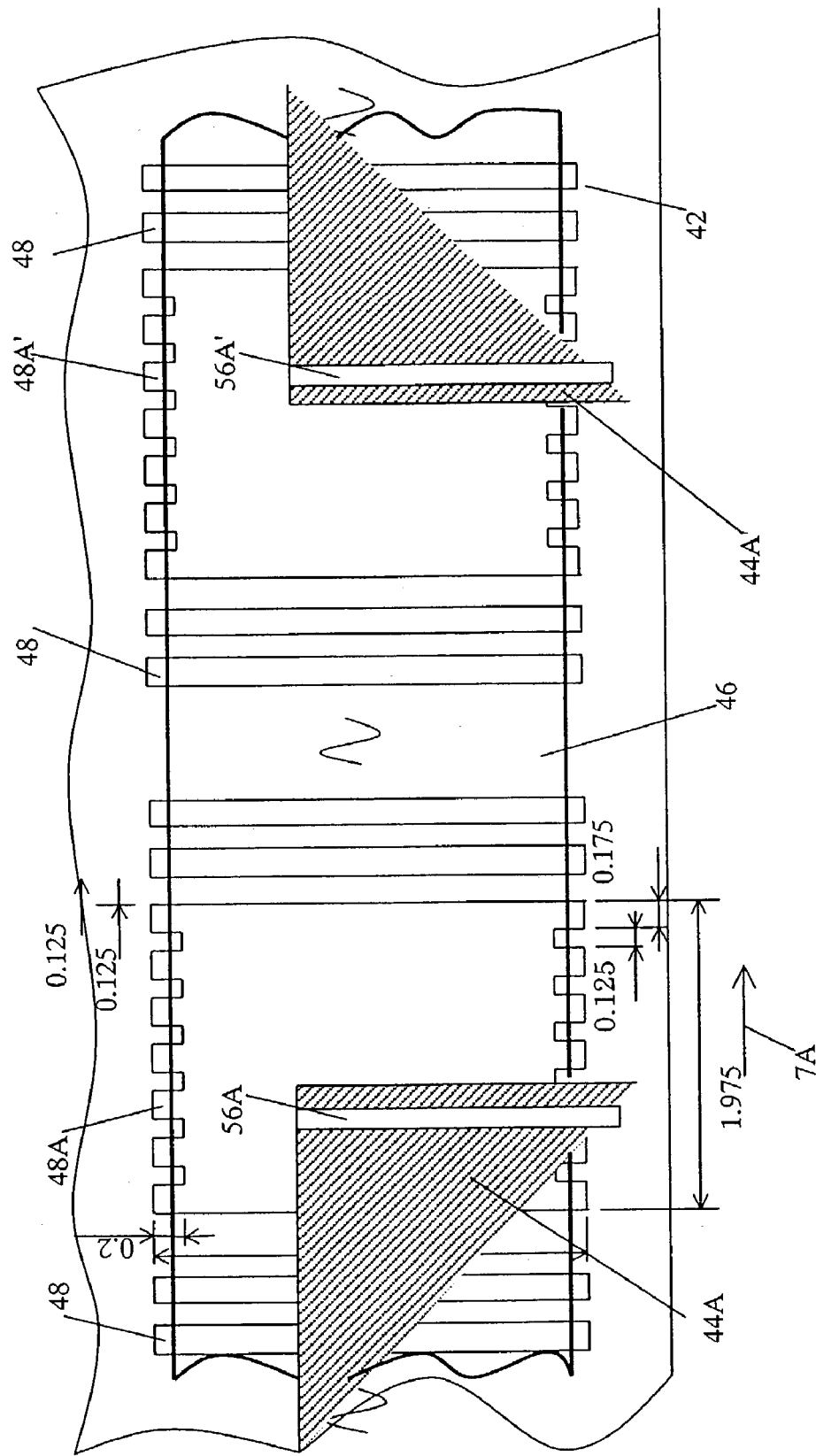
FIG. 7 is a plan view of a circuit board connection structure of Example 4 of the present invention.

As shown in FIG. 7, the circuit board 42 to be connected with a plurality of flexible printed wiring boards 44A and 44A' is provided with outermost first terminal electrodes 48A and 48A' to correspond with an outermost second terminal electrode 56A of the flexible printed wiring board 44A and an outermost second terminal electrode 56A' of the flexible printed wiring board 44A', respectively. Using these outermost first terminal electrodes, the plurality of flexible printed wiring boards 44A and 44A' can be aligned with the circuit board 42 in the optical way described in Example 1, for example.

As described above, in the circuit board connection structure according to the present invention, the conductive resin layer is prevented from separating from the terminal electrodes and the circuit board. In addition, the terminal electrodes of the two circuit boards can be electrically connected with each other with high precision without occurrence of a displacement from each other.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A circuit board connection structure comprising:
a first circuit board and a second circuit board bonded together with a conductive resin layer,
wherein the first circuit board has a first terminal region including a plurality of first terminal electrodes arranged in a first direction and a dummy electrode placed next to the first terminal region in the first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes, and
the conductive resin layer covers at least part of the dummy electrode, and the at least part of the dummy electrode covered with the conductive resin layer has a plurality of openings defined therein, and wherein said openings in the dummy electrode are laterally surrounded on all lateral sides by the dummy electrode, and the plurality of openings are arranged in the first direction and a second direction that is substantially perpendicular to the first direction.

2. The circuit board connection structure of claim 1, wherein each of the plurality of openings has a side parallel to the first direction and a side parallel to the second direction.

3. The circuit board connection structure of claim 1, wherein the conductive resin layer has a first side extending in the first direction and a second side extending in the second direction, the first side crosses the plurality of first terminal electrodes, and the second side is located on the dummy electrode.

4. The circuit board connection structure of claim 1, wherein at least part of a periphery of the dummy electrode has a concave and convex shape, and the first side of the conductive resin layer crosses the periphery of the concave and convex shape.

5. The circuit board connection structure of claim 1, wherein the dummy electrode has a misalignment check mark.

6. The circuit board connection structure of claim 1, wherein the first circuit board is a printed circuit board, and the second circuit board is a flexible board.

7. A display device having the circuit board connection structure of claim 1, comprising a display panel having the first circuit board as at least one substrate, and the second circuit board.

8. The display device of claim 7, wherein the display panel is a liquid crystal panel, an organic EL panel, an inorganic EL panel or a PDP.

9. A circuit board connection structure comprising:
a first circuit board and a second circuit board bonded together with a conductive resin layer,
wherein the first circuit board comprises a first terminal region including a plurality of first terminal electrodes arranged in a first direction and a dummy electrode placed next to the first terminal region in the first direction,
wherein the second circuit board comprises a second terminal region including a plurality of second terminal electrodes arranged in the first direction,
wherein the second terminal region faces the first terminal region via the conductive resin layer, the respective second terminal electrodes being electrically connected to the corresponding first terminal electrodes,
wherein the conductive resin layer covers at least part of the dummy electrode, and the at least part of the dummy electrode covered with the conductive resin layer has a plurality of openings, and
wherein the plurality of openings are arranged in a matrix in the first direction and a second direction substantially perpendicular to the first direction.

10. A circuit board connection structure comprising:
a first circuit board and a second circuit board bonded together with a conductive resin layer,
wherein the first circuit board comprises a first terminal region including a plurality of first terminal electrodes arranged in a first direction and a dummy electrode placed next to the first terminal region in the first direction,
wherein the second circuit board comprises a second terminal region including a plurality of second terminal electrodes arranged in the first direction,
wherein the second terminal region faces the first terminal region via the conductive resin layer, the respective second terminal electrodes being electrically connected to the corresponding first terminal electrodes,
wherein the conductive resin layer covers at least part of the dummy electrode, and the at least part of the dummy electrode covered with the conductive resin layer has a plurality of openings, and
wherein the plurality of openings have an identical shape and size.

11. A circuit board connection structure comprising:
a first circuit board and a second circuit board bonded together with a conductive resin layer,
wherein the first circuit board comprises a first terminal region including a plurality of first terminal electrodes arranged in a first direction and a dummy electrode placed next to the first terminal region in the first direction,
wherein the second circuit board comprises a second terminal region including a plurality of second terminal electrodes arranged in the first direction,
wherein the second terminal region faces the first terminal region via the conductive resin layer, the respective second terminal electrodes being electrically connected to the corresponding first terminal electrodes,
wherein the conductive resin layer covers at least part of the dummy electrode, and the at least part of the dummy electrode covered with the conductive resin layer has a plurality of openings, and
wherein an outermost first terminal electrode located outermost in the first direction among the plurality of first terminal electrodes is electrically connected with an outermost second terminal electrode located outermost in the first direction among the plurality of second terminal electrodes, and
the outermost first terminal electrode has a third side extending in the first direction, and the third side has a concave and convex shape.

12. The circuit board connection structure of claim 11, wherein the outermost first terminal electrode has two fourth sides extending in a second direction substantially perpendicular to the first direction, and the distance between the two fourth sides is greater than a width of each of the plurality of first terminal electrodes other than the outermost first terminal electrode in the first direction.

13. A display device including a circuit board connection structure comprising:
a first circuit board and a second circuit board bonded together with a conductive resin layer,
wherein the first circuit board comprises a first terminal region including a plurality of first terminal electrodes arranged in a first direction and a dummy electrode placed next to the first terminal region in the first direction,
wherein the second circuit board comprises a second terminal region including a plurality of second terminal electrodes arranged in the first direction,
wherein the second terminal region faces the first terminal region via the conductive resin layer, the respective second terminal electrodes being electrically connected to the corresponding first terminal electrodes,
wherein the conductive resin layer covers at least part of the dummy electrode, and the at least part of the dummy electrode covered with the conductive resin layer has a plurality of openings, and
wherein the display device further comprises a display panel having at least one substrate, the second circuit board connected to the at least one substrate, and the first circuit board.

14. The display device of claim 13, wherein the display panel is a liquid crystal panel, an organic EL panel, an inorganic EL panel or a PDP.

15. A circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes,
the outermost first terminal electrode has two first sides extending in the first direction, and each of the two first sides has a concave and convex shape and the two first sides are located on both edges of the outermost first terminal electrode along a second direction that is substantially perpendicular to the first direction, and
wherein the conductive resin layer is formed so that sides thereof extending in the first direction cross the two first sides of the outermost first terminal electrode, and a portion of the outermost first terminal electrode is covered by the conductive resin layer and at least a portion of each of the two first sides of the outermost first terminal electrode is not covered by the conductive resin layer.

16. The circuit board connection structure of claim 15, wherein the outermost first terminal electrode has two second sides extending in the second direction, and the distance between the two second sides is greater than a width of each of the plurality of first terminal electrodes other than the outermost first terminal electrode in the first direction.

17. The circuit board connection structure of claim 15, wherein the concave and convex shape of each of the two first sides of the outermost first terminal electrode has a plurality of third sides substantially parallel to the first direction and a plurality of fourth sides substantially parallel to the second direction.

18. The circuit board connection structure of claim 17, wherein the sides of the conductive resin layer in the first direction cross the plurality of fourth sides of the outermost first terminal electrode.

19. The circuit board connection structure of claim 15, wherein the outermost first terminal electrode has a plurality of openings.

20. The circuit board connection structure of claim 19, wherein each of the plurality of openings has a side parallel to the first direction and a side parallel to the second direction.

21. A circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes,
the outermost first terminal electrode has a first side extending in the first direction, and the first side has a concave and convex shape,
wherein the outermost first terminal electrode has a plurality of openings, and
wherein the plurality of openings are arranged in the first direction and a second direction substantially perpendicular to the first direction.

22. A circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes, the outermost first terminal electrode has a first side extending in the first direction, and the first side has a concave and convex shape, wherein the outermost first terminal electrode has a plurality of openings, and wherein the plurality of openings are arranged in a matrix in the first direction and a second direction substantially perpendicular to the first direction.

23. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, the outermost first terminal electrode has a first side extending in the first direction, and the first side has a concave and convex shape, wherein the outermost first terminal electrode has a plurality of openings, and wherein the conductive resin layer has a fifth side extending in the first direction and a sixth side extending in a second direction substantially perpendicular to the first direction, and at least part of the fifth side is placed in at least one opening among the plurality of openings of the outermost first terminal electrode, and at least part of the sixth side is placed in at least one opening among the plurality of openings of the outermost first terminal electrode.

24. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, the outermost first terminal electrode has a first side extending in the first direction, and the first side has a concave and convex shape, wherein the outermost first terminal electrode has a plurality of openings, and wherein the plurality of openings have an identical shape and size.

25. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, the outermost first terminal electrode has a first side extending in the first direction, and the first side has a concave and convex shape, and wherein the first circuit board further has a dummy electrode placed next to the first terminal region in the first direction, the conductive resin layer covers at least part of the dummy electrode, and the at least part of the dummy electrode covered with the conductive resin layer has a plurality of openings.

26. The circuit board connection structure of claim 25, wherein the plurality of openings of the dummy electrode are placed in a matrix in the first direction and a second direction substantially perpendicular to the first direction.

27. The circuit board connection structure of claim 25, wherein the conductive resin layer has a sixth side extending in a second direction substantially perpendicular to the first direction, and the sixth side is located on the dummy electrode.

28. The circuit board connection structure of claim 25, wherein at least part of a periphery of the dummy electrode has a concave and convex shape, the conductive resin layer has a fifth side extending in the first direction, and the fifth side of the conductive resin layer crosses the periphery of the concave and convex shape.

29. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, the outermost first terminal electrode has a first side extending in the first direction, and the first side has a concave and convex shape, and wherein the first circuit board is a printed circuit board, and the second circuit board is a flexible board.

30. A display device including a circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes,
the outermost first terminal electrode has a first side extending in the first direction, and the first side has a concave and convex shape, and
a display panel having at least one substrate, the second circuit board connected to the at least one substrate, and the first circuit board.

31. The display device of claim 30, wherein the display panel is a liquid crystal panel, an organic EL panel, an inorganic EL panel or a PDP.

32. A display device including a circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes,
the outermost first terminal electrode has a first side extending in the first direction, and the first side has a concave and convex shape, and
a display panel having the first circuit board as at least one substrate, and the second circuit board.

33. The display device of claim 32, wherein the display panel is a liquid crystal panel, an organic EL panel, an inorganic EL panel or a PDP.

34. A circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes, and
an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings defined therein, and wherein said openings in the first terminal electrode are laterally surrounded on all lateral sides by the first terminal electrode, and the plurality of openings are arranged in the first direction and a second direction that is substantially perpendicular to the first direction.

35. The circuit board connection structure of claim 34, wherein the outermost first terminal electrode has two first sides extending in second direction, and the distance between the two first sides is greater than a width of each of the plurality of first terminal electrodes other than the outermost first terminal electrode in the first direction.

36. The circuit board connection structure of claim 34, wherein each of the plurality of openings has a side parallel to the first direction and a side parallel to the second direction.

37. The circuit board connection structure of claim 34, wherein the first circuit board further has a dummy electrode placed next to the first terminal region in the first direction, the conductive resin layer covers at least part of the dummy electrode, and the at least part of the dummy electrode covered with the conductive resin layer has a plurality of openings.

38. The circuit board connection structure of claim 37, wherein the conductive resin layer has a third side extending in the second direction, and the third side is located on the dummy electrode.

39. The circuit board connection structure of claim 34, wherein the first circuit board is a printed circuit board, and the second circuit board is a flexible board.

40. A display device having the circuit board connection structure of claim 34, comprising a display panel having the first circuit board as at least one substrate, and the second circuit board.

41. The display device of claim 40, wherein the display panel is a liquid crystal panel, an organic EL panel, an inorganic EL panel or a PDP.

42. A circuit board connection structure comprising:
a first circuit board and a second circuit board bonded together with a conductive resin layer,
wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, and wherein the plurality of openings are arranged in a matrix in the first direction and a second direction substantially perpendicular to the first direction.

43. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, and wherein the conductive resin layer has a second side extending in the first direction and a third side extending in a second direction substantially perpendicular to the first direction, and at least part of the second side is placed in at least one opening among the plurality of openings of the outermost first terminal electrode, and at least part of the third side is placed in at least one opening among the plurality of openings of the outermost first terminal electrode.

44. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, and wherein the plurality of openings have an identical shape and size.

45. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, wherein the first circuit board further has a dummy electrode placed next to the first terminal region in the first direction, the conductive resin layer covers at least part of the dummy electrode, and the at least part of the dummy electrode covered with the conductive resin layer has a plurality of openings, and wherein the plurality of openings of the dummy electrode are placed in a matrix in the first direction and a second direction substantially perpendicular to the first direction.

46. A circuit board connection structure comprising:

a first circuit board and a second circuit board bonded together with a conductive resin layer, wherein the first circuit board has a first terminal region including a plurality of first terminal electrodes arranged in a first direction, the second circuit board has a second terminal region including a plurality of second terminal electrodes arranged in the first direction, the second terminal region is placed to face the first terminal region via the conductive resin layer, the respective second terminal electrodes being electrically connected to the corresponding first terminal electrodes, an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, wherein the first circuit board further has a dummy electrode placed next to the first terminal region in the first direction, the conductive resin layer covers at least part of the dummy electrode, and the at least part of the dummy electrode covered with the conductive resin layer has a plurality of openings, and wherein at least part of a periphery of the dummy electrode has a concave and convex shape, the conductive resin layer has a second side extending in the first direction, and the second side of the conductive resin layer crosses the periphery of the concave and convex shape.

47. A display device including a circuit board connection structure comprising:
a first circuit board and a second circuit board bonded together with a conductive resin layer,
wherein the first circuit board has a first terminal region including a plurality of first terminal electrodes arranged in a first direction,
the second circuit board has a second terminal region including a plurality of second terminal electrodes arranged in the first direction,
the second terminal region is placed to face the first terminal region via the conductive resin layer, the respective second terminal electrodes being electrically connected to the corresponding first terminal electrodes,
an outermost first terminal electrode located outermost in the first direction among the plurality of first terminal electrodes is electrically connected with an outermost second terminal electrode located outermost in the first direction among the plurality of second terminal electrodes, and the outermost first terminal electrode has a plurality of openings, and
wherein the display device further comprises a display panel having at least one substrate, the second circuit board connected to the at least one substrate, and the first circuit board.

48. The display device of claim 47, wherein the display panel is a liquid crystal panel, an organic EL panel, an inorganic EL panel or a PDP.

* * * * *